United States Patent [19]

Cutler et al.

[11] Patent Number: 5,751,585
[45] Date of Patent: May 12, 1998

[54] HIGH SPEED, HIGH ACCURACY MULTI-STAGE TOOL POSITIONING SYSTEM

[75] Inventors: Donald R. Cutler; Robert M. Pailthorp, both of Portland; Mark A. Unrath, Aloha, all of Oreg.

[73] Assignee: Electro Scientific Industries, Inc., Portland, Oreg.

[21] Appl. No.: 615,049

[22] Filed: Mar. 12, 1996

Related U.S. Application Data

[63] Continuation-in-part of Ser. No. 408,558, Mar. 20, 1995, abandoned.

[51] Int. Cl.$^6$ .............................. G06F 19/00; G06G 7/66
[52] U.S. Cl. .......................... 364/474.03; 364/474.14; 364/140; 364/181; 318/571; 318/590; 318/591; 318/592
[58] Field of Search ........................ 364/140, 181, 364/474.14, 474.03, 167.01; 318/569, 571, 590, 591, 592, 568.17

[56] References Cited

U.S. PATENT DOCUMENTS

| | | | |
|---|---|---|---|
| 4,532,402 | 7/1985 | Overbeck | 219/121 LU |
| 4,616,326 | 10/1986 | Meier et al. | 364/513 |
| 4,618,938 | 10/1986 | Sandland et al. | 364/552 |
| 4,873,478 | 10/1989 | Weiss | 318/779 |
| 4,941,082 | 7/1990 | Pailthorp et al. | 364/167.01 |
| 4,977,494 | 12/1990 | Galbaldon et al. | 364/167.01 |
| 4,990,840 | 2/1991 | Migda | 318/571 |
| 5,220,262 | 6/1993 | Kneifel, II | 318/569 |
| 5,255,199 | 10/1993 | Barkman et al. | 364/474.17 |
| 5,262,707 | 11/1993 | Okazaki et al. | 318/592 |
| 5,315,526 | 5/1994 | Maeda et al. | 364/474.28 |
| 5,377,096 | 12/1994 | Ono | 364/176 |
| 5,452,275 | 9/1995 | Ogawa | 369/44.11 |
| 5,453,594 | 9/1995 | Konecny | 219/121.61 |
| 5,453,933 | 9/1995 | Wright et al. | 364/474.23 |

*Primary Examiner*—Reba I. Elmore
*Assistant Examiner*—Ramesh Patel
*Attorney, Agent, or Firm*—Stoel Rives LLP

[57] ABSTRACT

A multi-rate positioner system (50) receives unpanelized positioning commands from a database storage subsystem (64), profiles the commands (72) into a half-sine positioning signal, and further processes the signal into a low-frequency positioning signal (LFP) and a high-frequency positioning signal (HFP) for actuating respective slow (56, 58) and fast (54) positioners to target locations on a workpiece (62). The slow and fast positioners move without necessarily stopping in response to a stream of positioning command data while coordinating their individually moving positions to produce temporarily stationary tool positions (140) over target locations defined by the database. The multi-rate positioning system reduces the fast positioner movement range requirement while providing significantly increased tool processing throughput.

22 Claims, 8 Drawing Sheets

HIGH SPEED, HIGH ACCURACY MULTI-STAGE TOOL POSITIONING SYSTEM

RELATED APPLICATION

This application is a continuation-in-part of U.S. patent application Ser. No. 08/408,558, filed Mar. 20, 1995 now abandoned.

TECHNICAL FIELD

This invention relates to an apparatus and a method for positioning a "tool," such as an optical instrument, a scanner, a laser beam or other radiation beams, relative to target locations on a workpiece and, in particular, to a system that accurately coordinates the positioning of such tools and target locations with a multi-stage positioner in which each stage is optimized for a particular combination of positioning speed and positioning distance.

BACKGROUND OF THE INVENTION

A variety of technologies employ tools to sense, micro-machine, or deposit patterns or materials on target locations on a workpiece. For example, micro-dimensioned drills may be used to form a cradle for a micro-dimensioned motor; a micro-dimensioned punch may be used to punch holes in a thin metal plate; a laser may be used to precisely machine or selectively erode metallic, crystalline, or amorphous specimens; a machine vision process may use a laser beam or an electron beam to scan workpieces having micron-sized features; a microscope may be positioned to inspect target locations on an integrated circuit; and ion beams may be used to selectively implant charged particles into an integrated circuit. All of the above-mentioned processes share a common requirement for accurately and rapidly positioning a pertinent tool to target locations on the workpiece.

Two emerging, but opposing, requirements exist for coordinating the relative motion between tools and workpieces. Namely, feature sizes are decreasing, causing the need for dimensional precision to increase, while at the same time the overall size of workpieces is increasing. Consequently, the accuracy, size, and speed requirements imposed on tool positioners are taxing the limits of existing positioning systems.

Existing positioners are typically characterized by low speed and long movement or high speed and short movement. Low speed and long movement positioners, such as X-Y translation tables, are characterized by high positional accuracy; whereas high-speed, short-movement positioners, such as galvanometer-driven beam deflectors, are characterized by deflection angle nonlinearities.

A solution for long movement, high-speed positioning is described in U.S. Pat. No. 4,532,402 issued Jul. 30, 1985 for METHOD AND APPARATUS FOR POSITIONING A FOCUSED BEAM ON AN INTEGRATED CIRCUIT in which a high-speed, short-movement positioner ("fast positioner"), such as a galvanometer, is combined with a long-movement, low-speed, but high-accuracy positioner ("slow positioner") such as an X-Y translation table. The two positioners are capable of combining short and rapid movement with long and accurate movement to accurately and rapidly position a tool, such as a laser beam, to target locations on a workpiece, such as an integrated circuit. The combined movement of the two positioners entails first moving the slow positioner to a known location near a target location on the workpiece, stopping the slow positioner, moving the fast positioner to the exact target location, stopping the fast positioner, causing the tool to operate on the target location, and then repeating the process for the next target location.

However, such a positioning method has serious drawbacks. Clearly, all the starting and stopping causes delays that unduly increase the time required for the tool to process the workpiece. A serious drawback is also imposed upon the computer-based machine tool control file or "database" that typically commands the tool to move to a series of predetermined target locations across the workpiece.

This drawback can be illustrated by the laser machining of a workpiece such as, for example, an integrated circuit of a type having a regular pattern of small features requiring trimming by a laser beam. The positioner and laser beam will cooperate efficiently if the slow positioner can accurately move the laser beam from pattern to pattern and the fast positioner can rapidly direct the laser beam to all of the small features requiring trimming within each pattern.

If, however, the size of the largest pattern exceeds the movement range of the fast positioner, the database positioning the tool across the workpiece must be "panelized" into abutting segments that each fit within the movement range of the fast positioner. The above-described trend toward increased dimensional precision and larger workpieces virtually guarantees the need for panelized databases. Panelization allocates the conflicting tasks of short, high-speed positioning and long, high-accuracy positioning into appropriate movement assignments for the fast and slow positioners.

Figure 1:
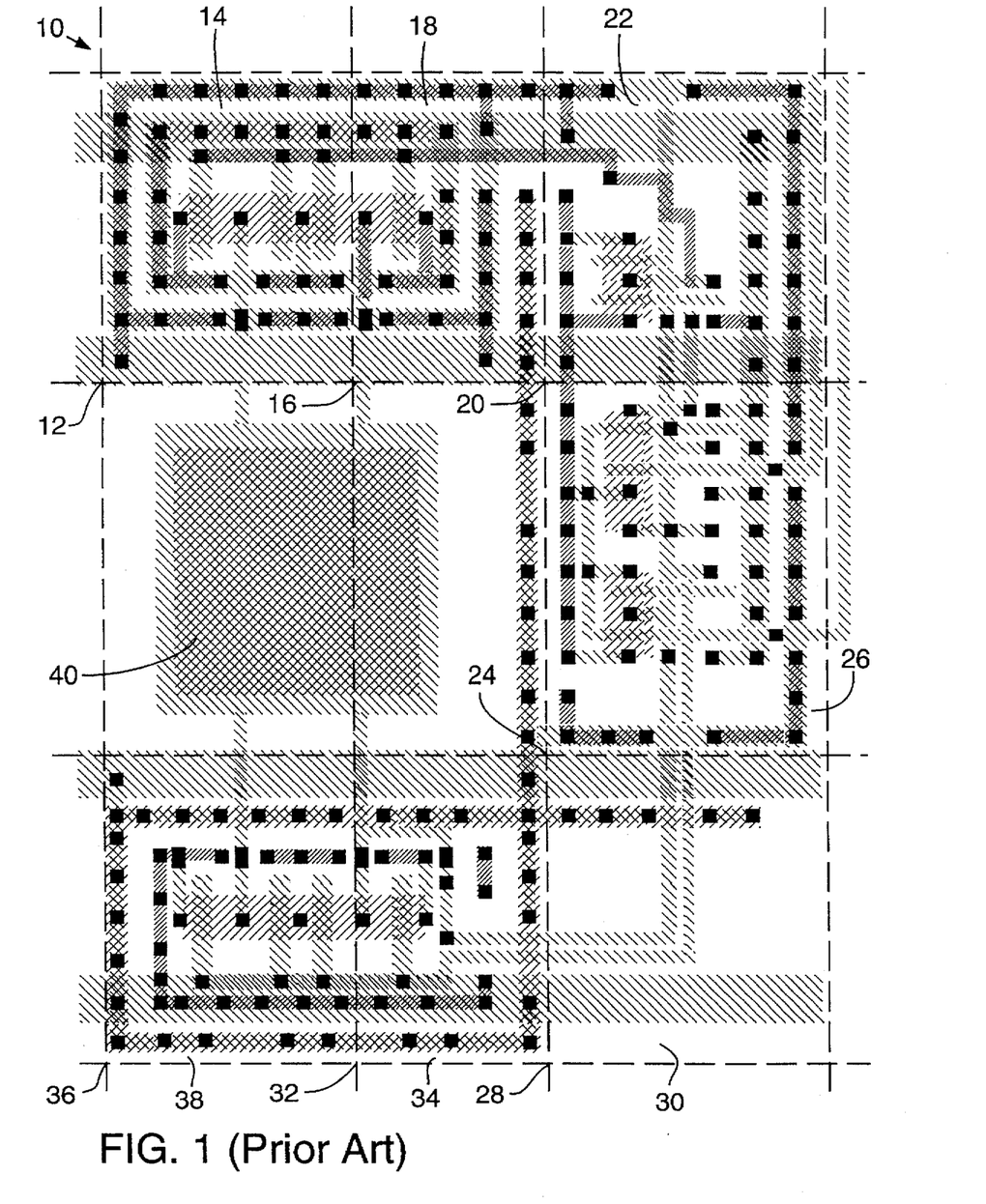
FIG. 1 is a pictorial plan view of an integrated circuit work field panelized for tool processing according to a prior art positioner movement panelization scheme.

For example, FIG. 1 shows a portion of an integrated circuit 10 having a substantially regular pattern of transistors and associated electrical interconnections that are amenable to processing with an ion implantation tool positioned by a panelized database. In this example, the threshold voltages of selected transistors are adjusted by controllably implanting boron ions into appropriate p-channel substrate regions of integrated circuit 10. The substrate areas to be doped cover a larger area than the movement range of the fast positioner. Therefore, the slow positioner drives the ion implantation tool into relative alignment with integrated circuit 10 at an origin 12 of a panel 14 (panels shown in dashed lines) after which movement the fast positioner executes the relatively short movements required between the ion implantation tool and integrated circuit 10 to process the substrate areas within panel 14 commanded by the database. After panel 14 is processed, the slow positioner moves the ion implantation tool into relative alignment with integrated circuit 10 at an origin 16 of a panel 18 after which movement the fast positioner executes the relatively short movements required between the ion implantation tool and integrated circuit 10 to process the substrate areas within panel 18 as commanded by the database.

The above described process is repeated by stepping through origins 20, 24, 28, 32, and 36 of respective panels 22, 26, 30, 34, and 38 until integrated circuit 10 has been completely processed. Note that an interconnect pad 40 is not completely enclosed within a single panel. Fortunately in this instance, interconnect pad 40 requires no ion implantation processing and can be ignored for panelization purposes.

Database panelization is at best an inefficient, approximate optimization that divides the tool path into several predetermined compartmentalized small movement command clusters that are inherently inefficient because the movements are executed incrementally.

Panelization also depends on the movement capacities of the particular positioners employed and the type of tool being positioned. For example, the panels assigned to integrated circuit 10 must be delineated in the database not only according to the pattern regularity of integrated circuit 10, but also according to the movement range of the fast positioner and specific target locations assigned to the ion implantation tool. If the tool type is changed, a different positioner type may be required that processes different features at different target locations. Either change would probably require that the database be repanelized to accommodate the new positioner and tool.

Panelization further requires that each panel within a database must abut adjacent panels within the workpiece without causing a tool operation to straddle or overlap a panel boundary. In the example of integrated circuit 10, if instead of an ion implantation tool a laser beam tool was employed to process metalization of interconnect pad 40, the panelization shown in FIG. 1 may not be suitable because interconnect pad 40 straddles two panels. The same problem can occur if the workpiece includes irregular patterns, such as target locations for holes in an etched circuit board. Some workpiece and tool type combinations are simply not conducive to panelization. And, of course, pattern regularity may repeat, albeit at a dimensional distance greater than the movement range of a particular fast positioner. Adapting a fast positioner having a sufficiently large movement range may be counter-productive because of added mass and nonlinearities.

What is needed, therefore, is an improved apparatus and method for accurately and rapidly positioning a wide variety of tools relative to a wide variety of workpieces without requiring an unduly massive fast positioner or a panelized tool path database.

SUMMARY OF THE INVENTION

An object of this invention is, therefore, to provide an improved apparatus and method for automatically and optimally allocating database positioning commands among multiple positioners in a tool path processing system.

Another object of this invention is to provide an apparatus and a method for performing tool path operations on an arbitrarily large workpiece without requiring a panelized database.

A further object of this invention is to provide an apparatus and a method for improving the throughput of tool path operations employing a positioning system.

Still another object of this invention is to provide an apparatus and a method for reducing the movement range and mass of a fast positioner employed in a positioning system.

A multi-rate positioner system of this invention receives unpanelized positioning commands from a database, profiles the commands into half-sine positioning signals, and further processes the half-sine positioning signals into low-frequency and high-frequency positioning signals for actuating the respective slow and fast positioners to target locations specified by the database. The slow and fast positioners move without necessarily stopping in response to a stream of positioning command data while coordinating their individually moving positions to produce temporarily stationary tool positions over target locations defined by the database. The multi-rate positioning system reduces the fast positioner movement range requirement while providing significantly increased tool processing throughput without requiring a panelized database.

In a first embodiment, an imperfect low-pass filter receives the half-sine positioning signal and substantially divides it into fast and slow positioning signals. An imperfect filter is employed to improve filter response time. Slow positioner errors caused by the nonresponse of the slow positioner to a high frequency feedthrough signal are corrected by directing these feedthrough-related errors to the fast positioner as part of the fast positioner command. Positioning errors caused by inertia and friction associated with the positioners are corrected by comparing the actual tool position with a commanded tool position in feedback networks that modify the slow and fast stage positioning signals.

In a second embodiment, the half-sine positioning signal is divided into its acceleration and position components. Tool processing throughput is further improved by passing the position component through a fourth-order profiling filter that has a fixed delay and produces low-frequency position and acceleration components for driving the slow positioner. The unfiltered position and acceleration components are delayed by the same amount as the fixed delay to produce high-frequency position and acceleration components for driving the fast positioner. Slow positioner errors caused by nonresponsiveness of the slow positioner to fast stage components fed through the profiling filter are corrected by directing these feedthrough-related errors to the fast positioner as part of the fast positioner command. Positioning errors caused by inertia and friction associated with the positioners are corrected by comparing the actual tool position with a commanded tool position in feedback networks that modify the slow and fast stage positioning signals.

Additional objects and advantages of this invention will be apparent from the following detailed description of preferred embodiments thereof, which proceed with reference to the accompanying drawings.

DETAILED DESCRIPTION OF PREFERRED EMBODIMENTS

Figure 2:
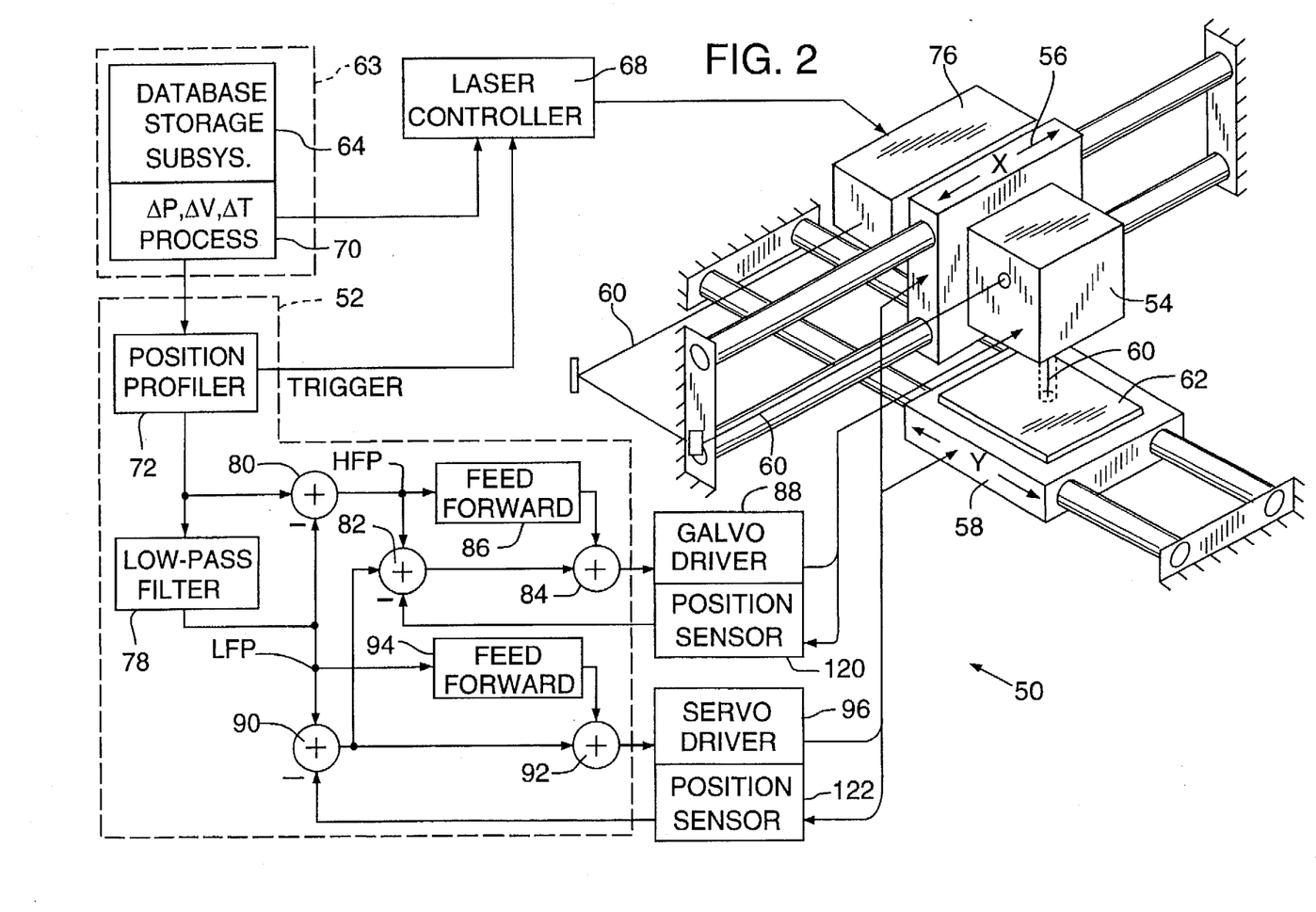
FIG. 2 is a pictorial block diagram of a first embodiment of a multi-stage laser beam positioning system of this invention.

FIG. 2 shows a multi-stage tool positioner system 50 having positioning command execution capabilities in accordance with this invention. Positioner system 50 is described only by way of example with reference to a laser-based hole cutting system that employs a digital signal processor ("DSP") 52 to control a fast galvanometer positioner stage 54 ("fast stage 54"), a slow X-axis translation stage 56 ("slow stage 56"), and a slow Y-axis translation stage 58 ("slow stage 58") to direct a laser beam 60 to target locations on a workpiece 62, such as an etched circuit board. Although positioner system 50 is configured with fast stage 54 mounted on slow stage 56 and workpiece 62 mounted on slow stage 58, other configurations of tool positioning systems, such as one in which fast stage 54 is mounted in a fixed position and workpiece 62 is mounted on slow stages 56 and 58, may advantageously employ this invention.

A system control computer 63 processes a tool path database stored in a database storage subsystem 64. The database contains the desired processing parameters for cutting holes and/or profiles with laser beam 60 in workpiece 62. The database is conventionally compiled using a tool path generating program, such as SMARTCAM™ manufactured by Point Control Software located in Eugene, Ore. System control computer 63 conveys parsed portions of the stored database to a laser controller 68 and position control portions of the database as a data stream to a delta process 70. Delta process 70 resolves the data stream into delta position ("dx" and "dy"), delta velocity ("dv"), and delta time ("dt") components for each intended change in the path of laser beam 60 across workpiece 62. Consequently, each movement of laser beam 60 is defined in dx, dy, dv, and dt components that are further processed by a position profiler 72 into a half-sine profiled positioning signal.

Laser controller 68 is controlled by timing data generated by delta process 70 and further coordinated by a triggering process that synchronizes the firing of a laser 76 to the motion of fast stage 54 and slow stages 56 and 58 according to a synchronization technique, such as one described in U.S. Pat. No. 5,453,594, issued Sep. 26, 1995, for RADIATION BEAM POSITION AND EMISSION COORDINATION SYSTEM, which is assigned to the assignee of this application.

Figure 3A:
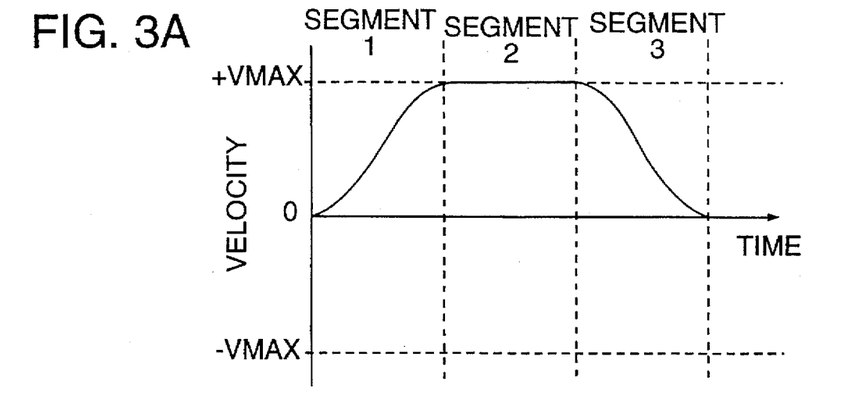
FIGS. 3A and 3B are time versus velocity graphs showing respective two- and three-segment positioner velocity profiles processed from positioning commands according to this invention.
Figure 3B:
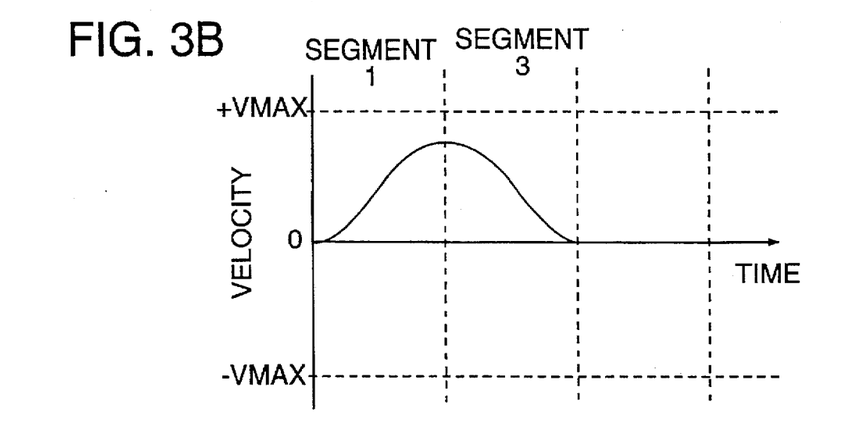

Delta process 70 generates the dx, dy, dv, and dt components in accordance with a preferred BASIC language signal processing procedure described below with reference to FIGS. 3A and 3B.

Before calling the preferred procedure, referred to as "gen_move," limiting values for Maximum Acceleration (amax), Maximum Velocity (vmax), and Minimum Time (tmin) are initialized. The limiting values are physical hardware limits imposed by the particular positioner hardware (fast or slow) that is required to move a majority of the distance in response to a particular positioning command. For example, if the movement distance is less than 25 percent of the maximum fast positioner movement range, then the values are set for the fast positioner. Otherwise the values are set for the slow positioned. Limiting values for fast stage 54 and slow stages 56 and 58 are:

|  | Fast | Slow |
|---|---|---|
| vmax (Meters/Second) | 1 | 0.25 |
| amax (g) | 50 | 1.0 |
| tmin (Milliseconds) | 2 | 20.0 |

Procedure gen_move calculates the dx, dy, dv, and dt values required for a positioner stage to move in either two or three movement segments from any initial position and initial velocity to any final position and final velocity.

All movement segments include some combination of a half-sine profiled acceleration segment ("segment 1"), a constant velocity segment ("segment 2"), and a half-sine profiled deceleration segment ("segment 3"). As shown in FIG. 3A, when a positioning command is sufficiently large to cause the positioner velocity to reach either +vmax or −vmax, segment 2 is included between segments 1 and 3. Otherwise, as shown in FIG. 3B, a two segment movement command is executed that includes only segments 1 and 3 (segment 2=0). Procedure gen_move generally conforms to, and skilled workers will readily understand, the following BASIC language description. PROCEDURE gen_move (g&,h&):

```
REMARK "g" and "h" are pointers into an indexed array
of positions and velocities extracted from the database.
    xi=px(g&)          !initial x position       !um
    yi=py(g&)          !initial y position
    xvi=vx(g&)         !initial x velocity       !um/sec
    yvi=vy(g&)         !initial y velocity
    xf=px(h&)          !final x position
    yf=py(h&)          !final y position
    xvf=vx(h&+1)       !final x velocity
    yvf=vy(h&+1)       !final y velocity
REMARK Calculate the maximum (or minimum) absolute
velocity for X and Y movement based on the total change in
position, initial and final velocities, and the minimum
movement time (limited to vmax).
dx=xf-xi
dy=yf-yi
xvmax=dx/tmin- (xvi+xvf) /2
IF xvmax>vmax
xvmax=vmax
ENDIF
IF xvmax<-vmax
xvmax=-vmax
ENDIF
REMARK Assumes that dt1 = dt3. If dt1 and dt3 = tmin,
maximum velocity is employed.
yvmax=dy/tmin- (yvi+yvf) /2
IF yvmax>vmax
yvmax=vmax
ENDIF
IF yvmax<-vmax
yvmax=-vmax
ENDIF
REMARK Calculate dt for segments 1 and 3, assuming
three segments are required to execute this particular
positioning command.
kpo2=(PI/2) /amax
dt1=MAX(tmin,ABS ((xvmax-xvi) *kpo2) ,ABS ((yvmax-yvi) *kpo2))
dt3=MAX(tmin,ABS ((xvf-xvmax) *kpo2) ,ABS ((yvf-yvmax) *kpo2))
REMARK Calculate dt2 for both the x and y axis (xdt2
and ydt2). If either result is positive, a constant
velocity segment 2 is required. xdt2 and ydt2 also
determine a dominant axis, i.e., the axis that requires
the most time to move at constant maximum velocity.
IF xvmax>0
xdt2=(dx-((xvi+vmax) *dt1/2) - ((xvf+vmax) *dt3/2)) /vmax
ELSE
xdt2=(dx-((xvi-vmax) *dt1/2) - ((xvf-vmax) *dt3/2)) /-vmax
ENDIF
IF yvmax>0
```

-continued

```
ydt2=(dy-((yvi+vmax) *dt1/2) - ((yvf+vmax) *dt3/2)) /vmax
ELSE
ydt2=(dy-((yvi-vmax) *dt1/2) - ((yvf-vmax) *dt3/2)) /-vmax
ENDIF
IF xdt2>0 OR ydt2>0 !three segment movement
REMARK Calculate dp,dv for each movement segment
IF xdt2>ydt2 !X axis Primary
  dx1=(xvi+xvmax) *dt1/2
  xdv1=xvmax-xvi
  dx2=((-xvi-xvmax) *dt1/2)+((-xvmax-xvf) *dt3/2) +dx
  xdv2=0
  dx3=(xvmax+xvf) *dt3/2
  xdv3 =xvf - xvmax
  ydt2=xdt2
  kb=1/ (2*ydt2+dt3+dt1)
  dy1=((yvi-yvf) * ((dt1*dt3) /2+(dy+yvi*ydt2) *dt1) *kb
  ydv1=((-yvi-yvf) *dt3+2*dy-2*yvi* (ydt2+dt1)) *kb
  dy2=(2*dy-dt1*yvi-dt2*yvf) *ydt2*kb
  ydv2=0
  dy3=((yvf-yvi) * ((dt3*dt1) /2+(dy+ydt2*yvf) *dt3) *kb
  ydv3=((yvi+yvf) *dt1-2*dy+2* (dt3+ydt2) *yvf) *kb
ELSE !Y primary axis
  dy1=(yvi+yvmax) *dt1/2
  ydv1=yvmax-xvi
  dy2=((-yvi-yvmax) *dt1/2) + ((-yvmax-yvf) *dt3/2) +dy
  ydv2=0
  dy3=(yvmax+yvf) *dt3/2
  ydv3 =yvf - yvmax
  xdt2=ydt2
  kb=1/ (2*xdt2+dt3+dt1)
  dx1=((xvi-xvf) * ((dt1*dt3) /2+ (dx+xvi*xdt2) *dt1) *kb
  xdv1=((-xvi-xvf) *dt3+2*dx-2*xvi* (xdt2+dt1)) *kb
  dx2=(2*dx-dt1*xvi-dt3*xvf) *xdt2*kb
  xdv2=0
  dx3=((xvf-xvi) * ((dt3*dt1) /2+ (dx+xdt2*xvf) *dt3) *kb
  xdv3= ((xvi+xvf) *dt1-2*dx+2* (dt3+xdt2) *xvf) *kb
ENDIF
ELSE !two segment movement
REMARK Calculate dtx and dty to determine dt for
  segments 1 and 3.
twomovetime (xvi,xvf,xi,xf,xdt)
twomovetime (yvi,yvf,yi,yf,ydt)
REMARK For two segment movement, dt1 = dt3 = the larger
  of dtx or dty.
dt1=MAX (xdt,ydt)
dt3=dt1
REMARK Calculate dp and dv for segments 1 and 3.
twosegmentmove
xdt2=0
ydt2=0
dx2=0
dy2=0
xdv2=0
ydv2=0
ENDIF
RETURN
REMARK End of procedure gen_move
PROCEDURE twosegmentmove
dx1=dx/2+xvi*dt1/4-xvf*dt1/4
xdv1=dx/dt1-3 *xvi/2-xvf/2
dy1=dy/2+yvi*dt1/4-yvf*dt1/4
ydv1=dy/dt1-3 *yvi/2-yvf/2
dx3=dx/2 xvi*dt3/4+xvf*dt3/4
xdv3=-dx/dt3+xvi/2+3*xvf/2
dy3=dy/2-yvi*dt3/4+yvf*dt3/4
ydv3=-dy/dt3+yvi/2+3*yvf/2
RETURN
PROCEDURE twomovetime (vi,vf,ip,fp,VAR dt)
LOCAL k1,k2,k3
dt=tmin
k1=3*vi+vf
kls=k1^2
k2=(32/PI) *amax* (fp-ip)
k3=PI/(8*amax)
IF kls+k2>0
dt=MAX(dt,k3* (-k1+SQR(kls+k2)))
ENDIF
IF kls-k2>0
dt=MAX(dt,k3*(k1+SQR(kls-k2)))
ENDIF
```

-continued

```
k1=vi+3*vf
kls=k1^2
IF kls+k2>0
dt=MAX(dt,k3* (-k1+SQR(kls+k2)))
ENDIF
IF kls-k2>0
dt=MAX(dt,k3* (k1+SQR(kls-k2)))
ENDIF
RETURN
```

Referring again to FIG. 2, the dx, dy, dv, and dt components generated by delta process 70 are further processed by position profiler 72 into the half-sine positioning signal required to cause fast stage 54 and slow stages 56 and 58 to move as commanded by the database. Ideally, positioner acceleration is proportional to motive force, and motive force is proportional to electrical current supplied to a positioner driver such as a linear or rotary servo motor or a galvanometer coil. Therefore, the positioning signal produced by position profiler 72 is a series of "full-spectrum" half-sine profiled acceleration-inducing positioning steps that cause movements such as those shown in FIGS. 3A and 3B. The full-spectrum bandwidth need only be about 250 Hertz, a bandwidth sufficient to drive galvanometer-driven mirror positioner 100 at its maximum frequency.

Instantaneous values of the full-spectrum positioning signal are generated by DSP 52 at a rate of about 10,000 points per second by employing the dx, dy, dv, and dt components generated by delta process 70 as variables for a sine value generation program running in DSP 52. Alternatively, the dx, dy, dv, and dt components may be employed to address and fetch associated sinusoidal waveform values stored in a sine value lookup table that is incorporated within DSP 52.

In a first embodiment, the resulting full-spectrum positioning signal is received by a low-pass filter 78 that passes a low-frequency position ("LFP") signal portion to an adder 80. Adder 80 functions as a high-pass filter by subtracting the LFP signal portion from the full-spectrum positioning signal to form a high-frequency position ("HFP") signal portion. The HFP and LFP signal portions together substantially equal the full-spectrum positioning signal generated by position profiler 72. Consequently, the HFP and LFP signals are processed and distributed, respectively, to fast stage 54 and slow stages 56 and 58, each of which is optimized to respond in substantially real time to the respectively applied position signal frequencies.

In particular, the HFP signal is processed through adders 82 and 84 and a feed forward process 86 to a galvanometer driver 88. Likewise, the LFP signal is processed through adders 90 and 92 and a feed forward process 94 to a linear servo motor driver 96. Galvanometer driver 88 provides deflection control current to a pair of mirror deflecting galvanometers in fast stage 54, and servo motor driver 96 provides control current to linear servo motors that control the positioning of slow stages 56 and 58.

Figure 4:
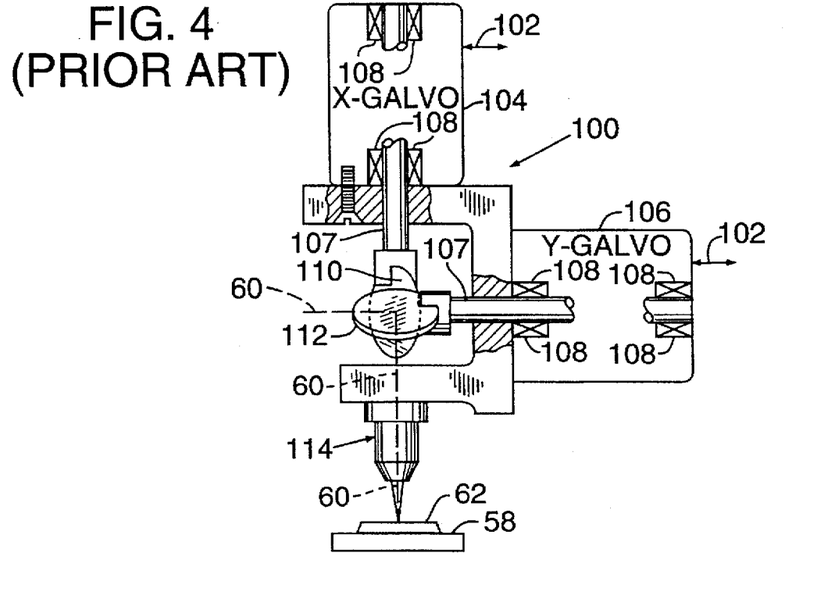
FIG. 4 is a fragmentary pictorial side view showing a prior art galvanometer-driven mirror positioner of a type suitable for use with this invention.

FIG. 4 shows a prior art galvanometer-driven mirror positioner 100 of a type suitable for use as fast stage 54. Galvanometer driver 88 (FIG. 2) provides rotational control current on conductors 102 to respective X-axis and Y-axis high-speed response D.C. motors 104 and 106 that rotate shafts 107 in bearings 108 to selectively pivot a pair of mirrors 110 and 112 that deflect laser beam 60 through an optional lens 114 to a predetermined target location on workpiece 62.

Alternatively, a nonbearing motion positioner, such as a piezoelectric element, a voice coil actuator, or other limited angle high-speed positioner device could be used in place of galvanometer-driven mirror positioner 100 in positioner system 50.

Likewise with reference to FIG. 2, alternative accurate rotary or linear positioner mechanisms may be substituted for the linear servo motors driving slow stages 56 and 58. However, in positioner system 50, ANORAD motors that preferentially respond to the LFP signal are preferred.

In the first embodiment, low-pass filter 78 has a 25 Hertz three-decibel rolloff frequency, has a 100 decibel per decade slope, and is implemented as a fifth-order (five stage) digital filter that compromises filtering effectiveness for fast response. Consequently, some high-frequency signals generated by position profiler 72 feed through low-pass filter 78 into the LFP signal portion causing the HFP signal portion conveyed from adder 80 to adder 82 to be missing some high-frequency components of the full-spectrum positioning signal. Nevertheless, accurate positioning requires that the entire positioning signal spectrum be processed. Therefore, because the LFP signal portion contains residual high frequencies to which fast stage 54 should respond but to which slow stages 56 and 58 cannot respond, the signal generated by adder 90 is also conveyed to adder 82 to cause fast stage 54 to respond to the residual high frequencies present in the LFP signal portion.

Moreover, two signals are added to each of the HFP and LFP signal portions to reduce positional errors between the commanded position and the actual position of laser beam 60 on workpiece 62. The HFP and LFP signal portions represent the ideal signal values required to cause the commanded positioning of stages 54, 56, and 58. However, practical factors such as gravity, friction, mass, and inaccuracies in the full-spectrum positioning signal generated by position profiler 72 are not contemplated in the unmodified HFP and LFP signal portions.

The practical factors are accounted for by sensing the actual positions of stages 54, 56, and 58 with position sensors 120 and 122 to provide predictive position feedback data to DSP 52. Position sensors 120 and 122 may be well-known types employing rotating capacitor plates, linear and rotary encoder scales, or interferometer motion detectors together with appropriate analog-to-digital and/or digital-to-analog conversion techniques.

As laser beam 60 undergoes movement across workpiece 62, the sensed beam position is continuously compared to the commanded beam position, with the positional difference representing a degree to which the practical factors have caused positioning errors. In particular, sensed position data of fast stage 54 are generated by position sensor 120 and subtracted from the commanded position at adder 82 to generate positional difference data that are combined in adder 84 with a next subsequent HFP signal portion conveyed by feed forward process 86. Likewise, sensed position data of slow stages 56 and 58 are generated by position sensor 122 and subtracted from the commanded position at adder 90 to generate positional difference data that are combined in adder 92 with a next subsequent HFP signal portion conveyed by feed forward process 94.

Figure 5:
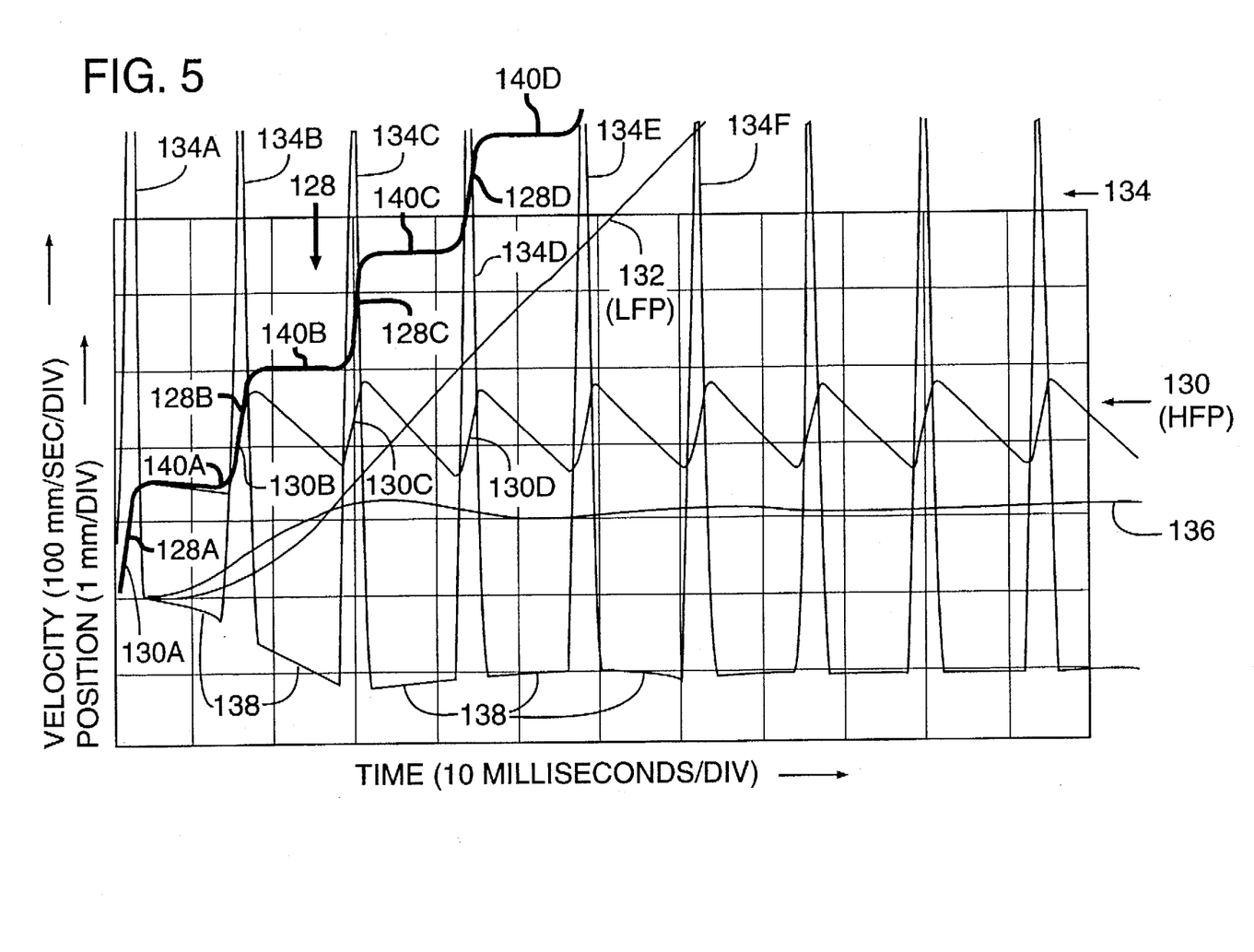
FIG. 5 is a waveform graph representing fast and slow positioner stage velocities and positions responsive to positioning signals according to this invention.

FIG. 5 graphically shows how fast stage 54 and slow stages 56 and 58 coordinate their movements in response to a representative full-spectrum positioning signal 128 (shown in bold lines), which is divided in DSP 52 (FIG. 2) into an HFP signal portion 130, and an LFP signal portion 132. HFP signal portion 130 represents the AC-coupled, 25–250 Hertz high-passband portion of full-spectrum positioning signal 128, and LFP signal portion 132 represents the direct-coupled, 0–25 Hertz low-passband portion of full-spectrum positioning signal 130.

Each half-sine profiled positioning step in full-spectrum positioning signal 128 (uniquely identified by a letter suffix, e.g., 128A, 128B, 128C, and 128D) causes a correspondingly identified step in HFP signal portion 130 (e.g., 130A, 130B, 130C, and 130D). In this example, each positioning step is separated from adjacent positioning steps by about 10 milliseconds, but the time separation, if any, is a function of timing data in the tool path database.

FIG. 5 further shows a resultant fast stage velocity waveform 134 and a resultant slow stage velocity waveform 136 that show, respectively, how fast stage 54 and slow stages 56 and 58 respond to HFP signal portion 130 and LFP signal portion 132.

In particular, HFP signal portions 130A, 130B, 130C, and 130D each include acceleration segments that cause fast stage 54 to undergo sine-profiled velocity changes as represented by corresponding fast velocity waveform pulses 134A, 134B, 134C, and 134D. Fast velocity waveform 134 has a baseline 138 that transitions in a negative velocity direction and settles at a value of about −100 millimeters per second. This baseline shift is caused by the combined signal processing effects of adders 80, 82, and 90 that couple a portion of LFP signal portion 132 into the HFP signal portion processing circuits.

HFP signal portion 130 also represents how fast stage 54 responds positionally to each of fast velocity pulses 134. The peak fast stage positioning displacement required in this example is about 2.8 millimeters, which is well within the 10 millimeter linear range of a low-mass, galvanometer-driven mirror positioner.

LFP signal portion 132 also represents how slow stages 56 and 58 respond positionally to slow velocity waveform 136. Slow stage velocity waveform 136 transitions in a positive velocity direction and settles at a value of about +100 millimeters per second. In this example, the slow stage position changes linearly with time such that at least one of slow stages 56 and 58 do not stop moving.

Full-spectrum positioning signal 128 also represents the net positions resulting from the combined fast and slow stage positions represented respectively by waveforms 132 and 130. Plateaus 140A, 140B, 140C, and 140D indicate 10 millisecond time periods during which the coordinated position is stationary even though stages 54, 56, and 58 may all be moving. This is clearly shown for plateau 140C, directly under which waveforms 130 and 132 intersect with substantially equal and opposite slopes. Plateaus 140 correspond to time periods during which laser 76 may be triggered to cut holes in workpiece 62.

Figure 6:
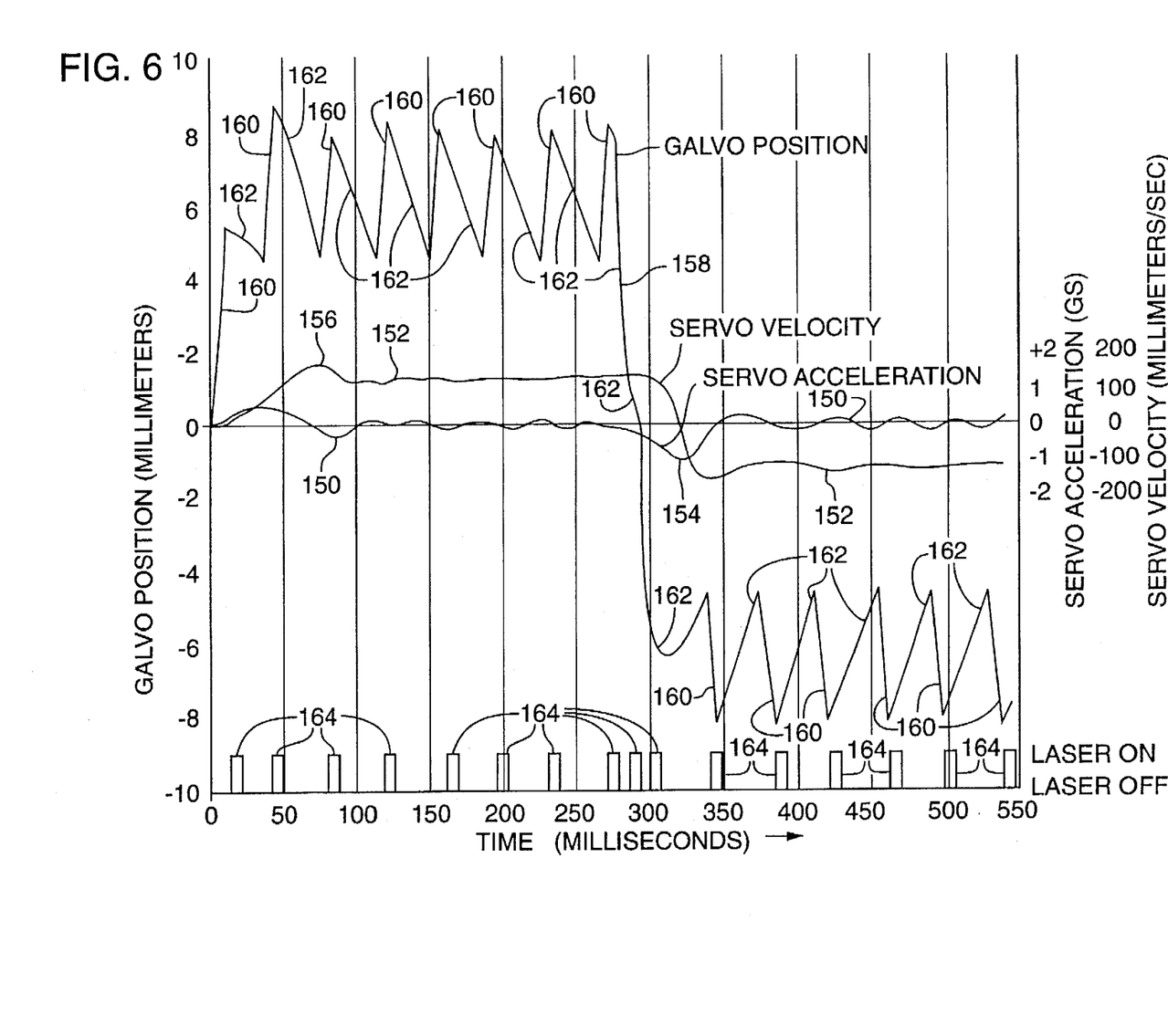
FIG. 6 is a waveform graph representing the time and movement parameters required to position the fast and slow stages for laser drilling 16 holes according to the first embodiment of this invention.

With reference to FIGS. 2 and 6, tool processing throughput of the first embodiment of multi-stage tool positioner system 50 was evaluated by computer modeling a wide variety of movement profiles and sequences. It was learned that as the move lengths increased beyond about 3 millimeters and the laser hole drilling times decreased below about 5 milliseconds, the 1 g acceleration limit of slow stages 56 and 58 was exceeded. In particular, a sequence of moves and drills in one direction immediately followed by a sequence of moves and drills in the opposite direction would exceed the 1 g acceleration limit when the movement direction reversed.

A proposed solution to this limitation entailed reducing the cutoff frequency of low-pass filter 78 to reduce the acceleration of slow stage 58 and adding a feedback loop from the output of adder 80 to position profiler 72. FIG. 6 shows for the proposed solution the resulting timing and positioning movements of fast stage 54 and slow stages 56 and 58 required for laser 76 to drill 16 holes in workpiece 62. Motion of slow stages 56 and 58 is represented by a servo acceleration waveform 150 and a servo velocity waveform 152. Servo acceleration waveform 150 shows a peak acceleration 154 of about 1 g, which is within the required acceleration limit, and servo velocity waveform 152 shows a peak velocity 156 of about 175 millimeters per second, which is well within the 250 millimeter per second limit.

Fast stage 54 motion is represented by a galvo position waveform 158 that includes repositioning movements 160 and position coordinating movements 162. 50 millisecond pulses of laser 76 are represented by laser waveforms 164.

Optimal throughput of tool path operations typically require pulsing laser 76 during the position coordinating movement 162 that immediately follows each repositioning movement 160. Unfortunately, the proposed solution required delaying the start of each repositioning movement 160 until fast stage 54 was far enough from its 10 millimeter travel limit to ensure that the next repositioning movement 160 could be made without exceeding the 10 millimeter travel limit. Therefore, while the proposed solution did control the acceleration, it significantly limited throughput for sequences of long moves greater than about three millimeters. FIG. 6 shows that the proposed solution required 550 milliseconds to drill 16 holes with laser 76.

Figure 7:
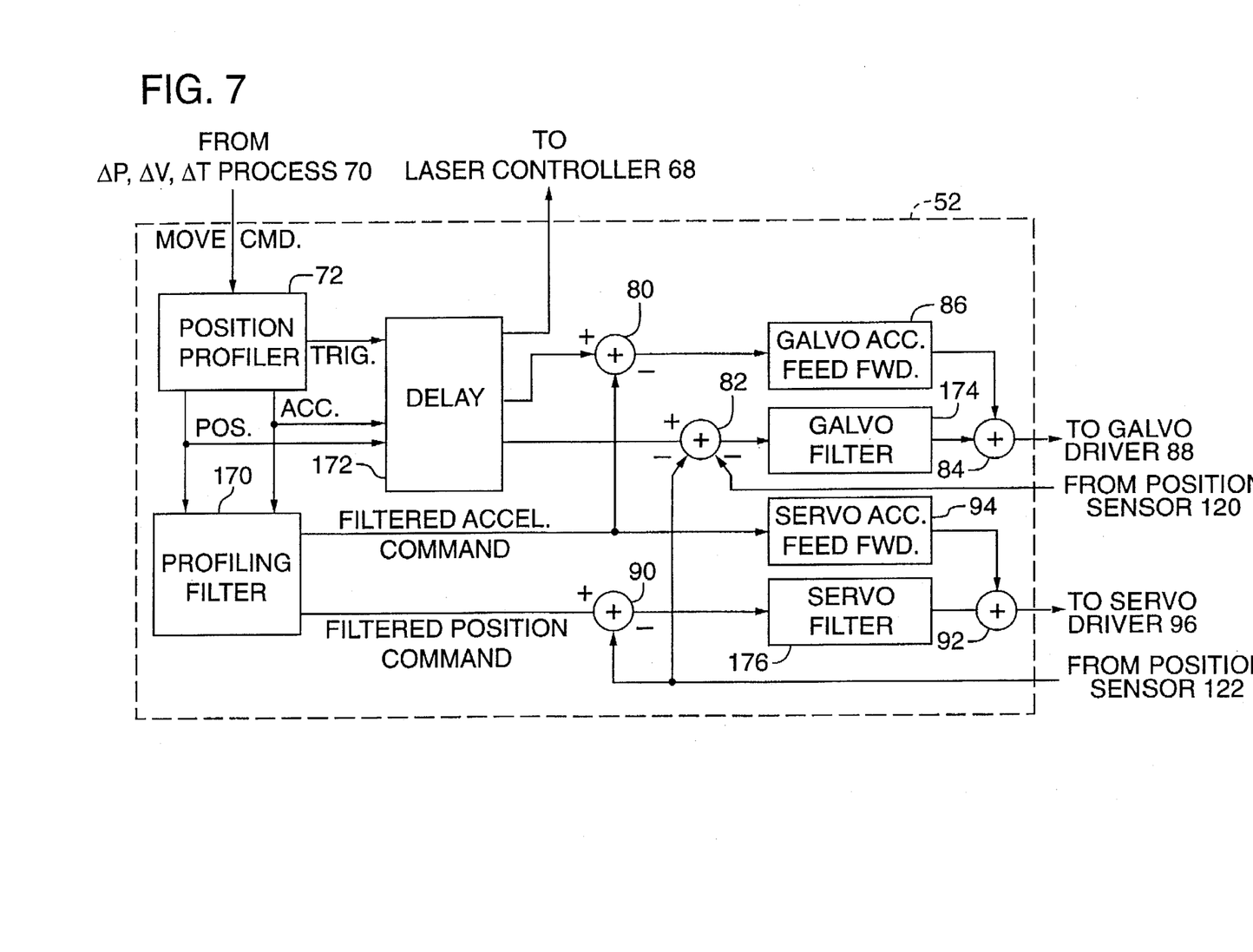
FIG. 7 is a pictorial block diagram of a second embodiment of a multi-stage laser beam positioning system of this invention.

FIG. 7 shows a second embodiment of DSP 52 in which tool processing throughput was improved by replacing low-pass filter 78 (FIG. 2) with a profiling filter 170 having a constant delay and adding a delay element 172 between position profiler 72 and adders 80 and 82 to compensate for the constant delay of profiling filter 10. Delay element 172 also delays, and thereby, synchronizes the laser triggering pulses generated by position profiler 72 and directed to laser controller 68. Profiling filter 170 and delay element 172 cooperate to move slow stages 56 and 58 smoothly over the average position profile while limiting its acceleration to ±1 g and cooperate to limit fast stage 54 positioning movements to ±10 millimeters.

The half-sine positioning signal generated by position profiler 72 includes a position component and an acceleration component. The position component is received by profiling filter 170 to produce filtered position command data for driving slow stages 56 and 58.

Profiling filter 170 is preferably a fourth-order low-pass filter represented below by Eq. 1.

$$G(s) = \left[ \frac{1}{\left(\frac{s}{\omega}\right)^2 + \frac{2\zeta s}{\omega} + 1} \right]^2 \quad (1)$$

In Eq. 1, ω is the natural, or cutoff, frequency of profiling filter 170 and ζ is its damping ratio. Preferably, ω equals 38 radians per second and ζ equals 0.707. The 0.707 value of ζ is referred to as the critical damping ratio because it produces a phase lag that is linear with frequency up to a natural frequency ωn of profiling filter 170. The linear phase lag results in a constant time delay for any half-sine positioning signal having a frequency content up to the natural frequency. For the Eq. 1 filter, the time delay equals 4ζ/ω seconds.

Because profiling filter 170 produces filtered position command data having a constant time delay with respect to the half-sine positioning signal position component, the constant time delay is compensated for by delay element 172. Delay element 172 is preferably implemented by DSP 52 as a programmed delay in conveying the half-sine positioning signal acceleration and position components from position profiler 72 to adders 80 and 82.

Thereby, half-sine positioning signals directed to fast stage 54 are time synchronized with the filtered position commands directed to slow stages 56 and 58.

The acceleration command from position profiler 72 is also filtered by profiling filter 170 to provide a servo acceleration feed forward signal to adder 80 and feed forward process 94. In a manner similar to the first embodiment, adder 80 functions as a high-pass filter by subtracting the servo acceleration feed forward signal from the acceleration component of the full-spectrum positioning signal to form a galvo acceleration feed forward signal, which is conveyed to feed forward process 86. Likewise, the filtered position command from profiling filter 170 and the delayed position component of the half-sine positioning signal are conveyed respectively to adders 90 and 82 for processing and distribution, respectively, to slow stages 56 and 58 and fast stage 54. A galvo filter 174 and a servo filter 176 are conventional loop compensation filters that function to keep fast stage 54 and slow stages 56 and 58 stable.

Figure 8A:
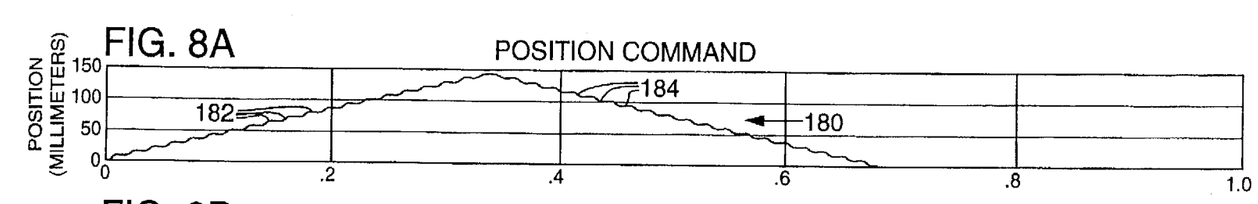
FIGS. 8A to 8E are waveform graphs representing the acceleration and position versus time required to position the fast and slow stages along a generally triangular stair-stepped movement profile with the second embodiment of this invention.
Figure 8B:
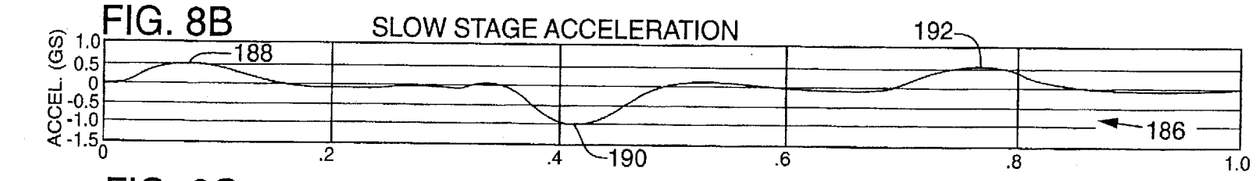

The ±1 g acceleration capability of slow stages 56 and 58 and the ±10 millimeter travel limit of fast stage 54 constrain the parameters of the half-sine positioning signal generated by position profiler 72 and the cutoff frequency of profiling filter 170. These constraints are described with reference to FIGS. 8A to 8E, which show exemplary waveforms in response to a triangular move profile 180 shown in FIG. 8A. Triangular move profile 180 includes a series of upwardly moving positioning steps 182 followed by a series of downwardly moving positioning steps 184. Slow stages 56 and 58 respond as shown in FIG. 8B in which a slow stage acceleration waveform 186 represents slow stages 56 and 58 undergoing acceleration impulses 188, 190, and 192 at the beginning, middle, and end, respectively, of triangular move profile 180. Multiple high-frequency acceleration impulses occur at each of positioning steps 182 and 184 but are filtered out by profiling filter 170 leaving slow stage acceleration waveform 186.

As the cutoff frequency of profiling filter 170 is decreased (heavier filtering), the maximum amplitude of acceleration impulses 188, 190, and 192 decreases. Therefore, for a particular slow stage acceleration limit (e.g., 1 g), the cutoff frequency can be set using this constraint.

Figure 8C:
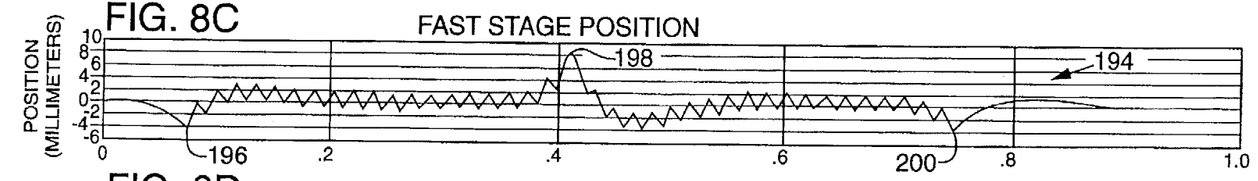

However, another constraint sets a lower bound on the cutoff frequency. Because of profiling filter 170, the actual position profile of slow stages 56 and 58 does not exactly follow the waveform of triangular move profile 180, but is more "rounded." As shown in FIG. 8C, this causes the positioning of fast stage 54 (i.e., the difference between triangular move profile 180 and the move profile of slow stages 56 and 58) to move as represented by a fast stage positioning waveform 194. Examining FIGS. 8B and 8C reveals that the position of fast stage 54 reaches maxima 196, 198, and 200 at times corresponding to acceleration impulses 188, 190, and 192 of slow stage acceleration waveform 186. Unfortunately, decreasing the cutoff frequency of profiling filter 170 acts to increase the maximum movement of fast stage 54. Therefore, a compromise must be reached between limiting slow stage acceleration and fast stage positioning.

Another variable that can be used to reach this compromise is the shape of the desired move profile. By varying the maximum velocity, acceleration, and/or on time of laser 76 for the individual steps in the desired move profile, the magnitude of acceleration impulses 188, 190, and 192 can be controlled. Lowering the acceleration impulse magnitude allows the cutoff frequency of profiling filter 170 to be increased, which in turn decreases the maximum movement of fast stage 54.

Move profile acceleration and/or laser on-times may also be set as a function of movement distance. A further improvement in throughput is possible by predicting the maximum slow stage acceleration as a function of prior positioning steps and tailoring the acceleration or laser on-time of the next step to place a bound on the predicted acceleration.

Profiling filter 170 is implemented by cascading two or more second-order filters having critical damping ratios. As the number of cascaded filters increases beyond two, their cutoff frequencies increase by about the square root of the number of filters (e.g., two filters have cutoffs that are 1.414 times the cutoff for a single filter). Preferably two filters are cascaded to provide good smoothing while keeping the overall filter implementation simple.

The profiling filter response represented by Eq. 1 can be expressed as a discrete equivalent through a bilinear transformation. The resulting digital transfer function is represented below by Eq. 2.

$$G z(z) = \frac{k(z^2 + 2z + 1)^2}{(z^2 + b_1 z + b_2)^2} \quad (2)$$

The time-domain equations for filter outputs ($y_k$) and ($w_k$), given prior inputs and outputs, are represented below by Eqs. 3 and 4.

$$y_k = w_k + 2w_{k-1} + w_{k-2} - b_1 y_{k-1} - b_2 y_{k-2} \quad (3)$$

$$w_k = k(V_k + 2V_{k-1} + V_{k-2}) - b_1 w_{k-1} - b_2 w_{k-2} \quad (4)$$

The coefficients in Eqs. 3 and 4 are determined as represented below in Eq. 5.

$$\begin{bmatrix} k \\ b1 \\ b2 \end{bmatrix} = \begin{bmatrix} \left( \frac{\omega^2 T^2}{4 + 4\zeta T\omega + T^2\omega^2} \right)^2 \\ \frac{-8 + 2T^2\omega^2}{4 + 4\zeta T\omega + T^2\omega^2} \\ \frac{-4\zeta T\omega + 4 + T^2\omega^2}{4 + 4\zeta T\omega + T^2\omega^2} \end{bmatrix} \quad (5)$$

In Eq. 5, T is the sample period of the filter, $\omega$ is its cutoff frequency, and $\zeta$ is its damping ratio.

For profiling filter 170, the preferred 38 radian per second cutoff frequency (about 6 Hertz) is a very low frequency compared to the 10 kilohertz rate at which DSP 52 updates positioning data for slow stages 56 and 58. If profiling filter 170 runs at the 10 kilohertz slow stage update frequency, the discrete filter coefficients become sensitive to roundoff errors because the poles of the discrete filter move close to the unit circle. Therefore, it is preferred that profiling filter 170 run as two second-order filters as represented in Eqs. 3 and 4 to reduce the order of the filter equation and to keep the filter coefficients reasonably controlled. Profiling filter 170 also receives the acceleration command from position profiler 72 and generates the filtered acceleration command that is conveyed to servo feed forward process 94 and to adder 80.

The desired move profile commands are preferably calculated at the 10 kilohertz updating rate, and the slow stage acceleration and actual (not commanded) position is subtracted therefrom at adders 80 and 82 to produce, respectively, the fast stage acceleration and position command signals.

As shown in FIG. 8C, for a properly implemented profiling filter 170, the fast stage position dithers about 0 (after transients decay) for long moves. If the delay of profiling filter 170 is not matched by delay element 172, the fast stage position will remain above and below zero in response to upwardly moving positioning steps 182 and downwardly moving positioning steps 184, respectively.

Figure 8D:
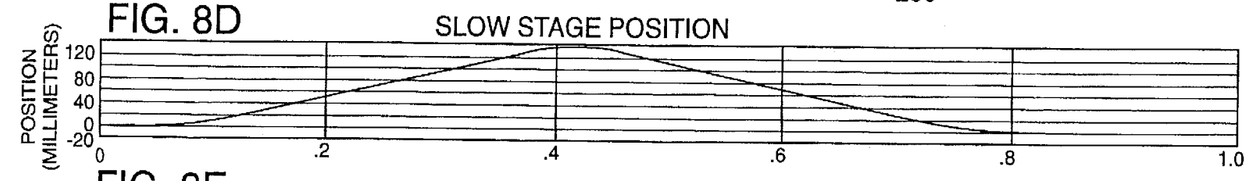
Figure 8E:
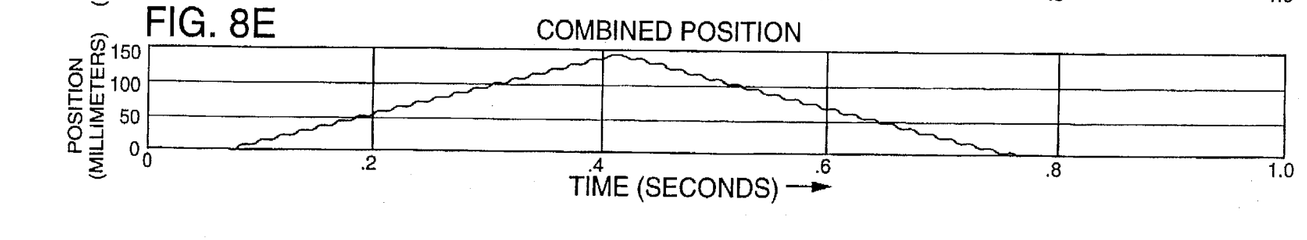

FIG. 8D shows the resulting slow stage position, and FIG. 8E shows the combined position resulting from fast and slow stage movements represented in FIGS. 8C and 8D. Note that the combined position shown in FIG. 8E lags triangular move profile 180 of FIG. 8A by about 74 milliseconds, which is about the constant delay of profiling filter 170 and delay element 172.

Figure 9:
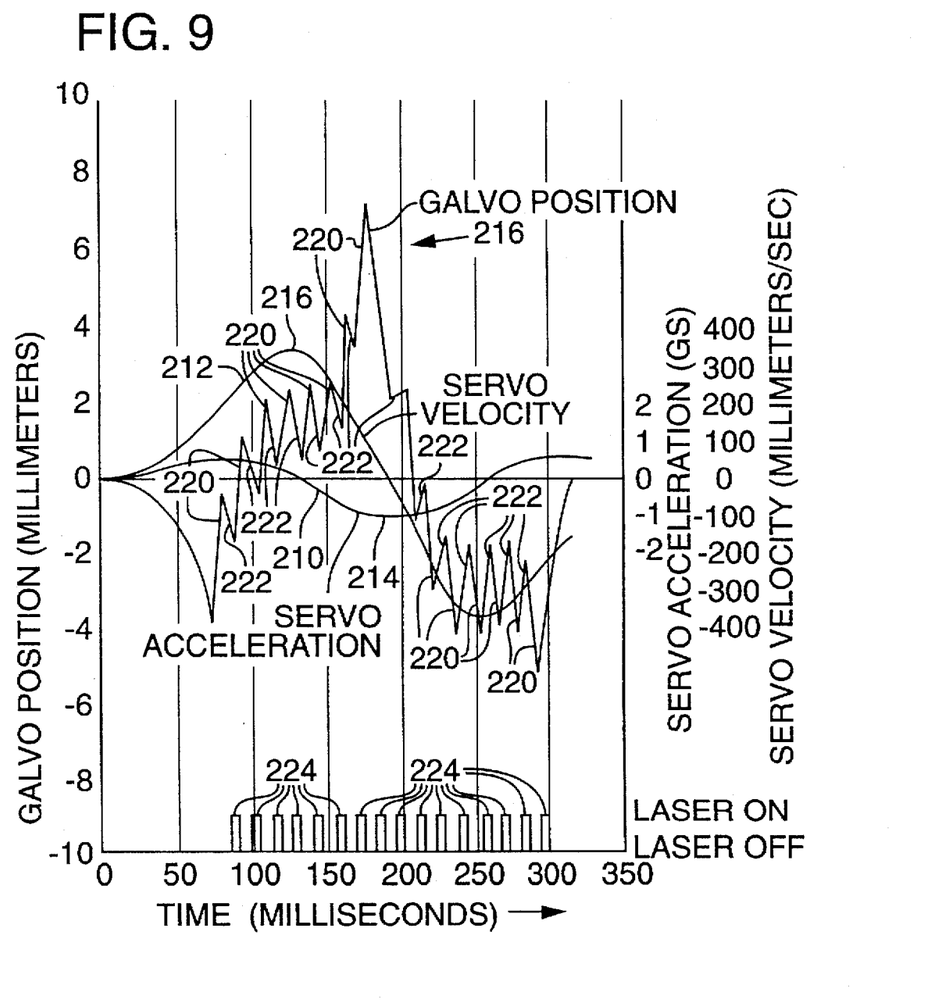
FIG. 9 is a waveform graph representing the time and movement parameters required to position the fast and slow stages for laser drilling 16 holes according to the second embodiment of this invention.

FIG. 9 shows for the second embodiment the resulting timing and positioning movements of fast stage 54 and slow stages 56 and 58 required for laser 76 to drill 16 holes in workpiece 62. Motion of slow stages 56 and 58 is represented by a servo acceleration waveform 210 and a servo velocity waveform 212. Servo acceleration waveform 210 shows a peak acceleration 214 of about 1 g, which is within the required acceleration limit, and servo velocity waveform 212 shows a peak velocity 216 of about 375 millimeters per second.

Fast stage 54 motion is represented by a galvo position waveform 218 that includes repositioning movements 220 and position coordinating movements 222. Fifty millisecond pulses of laser 76 are represented by laser waveforms 224.

As described with reference to FIG. 6, optimal throughput of tool path operations typically require pulsing laser 76 during the position coordinating movement 222 that immediately follows each repositioning movement 220. FIG. 9 shows that the second embodiment requires only 300 milliseconds to drill 16 holes with laser 76. Actually the comparison between FIGS. 6 and 9 is even more striking (225 milliseconds versus 550 milliseconds) because in typical applications the up-front delay of about 75 milliseconds to the first hole occurs only once for a sequence of several hundred holes. As a further advantage of the second embodiment, fast stage 54 operates more centered in its range of travel, which improves its positioning accuracy.

The foregoing embodiments carry out signal processing for an unspecified single axis of motion for each of the fast and slow positioner stages. Skilled workers will readily understand how to replicate the signal processing to coordinate the motion of both axes and both stages.

The above-described coordinated positioning is particularly beneficial for applications such as laser beam hole cutting that requires rapid movement between target locations along a tool path combined with pauses at each target location to fire the laser to cut a hole but, of course, is not limited to that application.

This invention provides an improved combination of positioning accuracy, positioning speed, minimized or eliminated stopping time, nonpanelized tool path databases, and minimized fast stage movement range requirements.

Skilled workers will recognize that portions of this invention may be implemented differently from the laser beam micro-machining implementation described above. For example, a wide variety of tools may be moved by the fast positioner stage, such as micro-dimensioned drills, punches, lasers, laser beams, radiation beams, particle beams, beam producing devices, microscopes, lenses, optical instruments, and cameras. Also, many different positioning devices may be employed in different combinations drawn from among galvanometers, voice coils, piezoelectric transducers, stepper motors, and lead screw positioners. The DSPs need not be completely digital and may, for example, include any suitable combination of analog and digital subcircuits. Of course, the positioning signal profiles, spectral bandwidth and amplitudes, and filter characteristics described herein may all be modified to suit the requirements of other positioning applications.

It will be obvious to skilled workers that many changes may be made to the details of the above-described embodiments of this invention without departing from the underlying principles thereof. The scope of the present invention should, therefore, be determined only by the following claims.

We claim:

1. In a tool positioning system that is implemented as part of a workpiece processing system in which the workpiece is an electronic device or an electronic device package, the tool position system positioning a tool relative to a set of target locations and describing a tool path on a workpiece in response to a set of positioning commands, comprising:

a first positioner stage effecting at a first positioning acceleration a controlled first range of relative movement between the tool and the workpiece;

a second positioner stage effecting at a second positioning acceleration a controlled second range of relative movement between the tool and the workpiece, the second controlled range of relative movement being greater than the first controlled range of relative movement, and the second positioning acceleration being less than the first positioning acceleration;

a signal processor deriving from the set of positioning commands a movement-controlling signal;

a filter receiving the movement-controlling signal and separating it to produce higher bandwidth and lower bandwidth positioning signals that have an inherent delay offset between them;

a delay element introducing a delay to compensate for the inherent delay offset between the higher bandwidth and lower bandwidth positioning signals; and first and second positioner drivers responsive to the delay compensated higher bandwidth and lower bandwidth positioning signals to drive the respective first and second positioner stages so that they respond by operating within their controlled ranges of relative movement with at least partly uninterrupted concurrent motion in a coordinated fashion to produce accurate tool positioning along the tool path.

2. The tool positioning system of claim 1 in which the tool is at least one of a drill, a punch, a laser, a laser beam, an ion beam, a radiation beam, a microscope, a lens, an optical scanner, and a camera.

3. The tool positioning system of claim 1 in which each of the first and second positioner stages is moved by at least one of a galvanometer, a voice coil, a piezoelectric transducer, a stepper motor, a rotary servo motor, a linear servo motor, and a lead screw.

4. The tool positioning system of claim 1 in which at least one of the first and second positioner stages is capable of positioning the tool along two orthogonal axes.

5. The tool positioning system of claim 1 in which the second positioner stage includes an X-axis translation stage and a Y-axis translation stage and the first positioner stage is mounted on the X-axis translation stage.

6. The tool positioning system of claim 5 in which the workpiece is mounted on the Y-axis translation stage.

7. The tool positioning system of claim 1 in which the concurrent motion of the first and second positioner stages is such that the tool is rendered temporarily stationary relative to the workpiece while the first and second positioner stages are moving.

8. The tool positioning system of claim 1 in which the delay element is implemented as a programmed delay that is executed by the signal processor.

9. The tool positioning system of claim 1 in which the filter employs a low-pass filtering function to generate the lower bandwidth positioning signal.

10. The tool positioning system of claim 1, further comprising:

first and second sensors for sensing actual positions of the first and second positioner stages, the signal processor calculating first and second positional differences between a commanded position specified by a corresponding one of the positioning commands and the first and second actual positions; and first and second control elements operating in response to the first and second positional differences to develop first and second drive signals that are applied to the respective first and second positioner stages to correct errors in the first and second actual positions.

11. In a tool positioning system that is implemented as part of a workpiece processing system in which the workpiece is an electronic device or an electronic device package, the tool positioning system including a first positioner that effects at a first positioning acceleration a controlled first range of relative movement between a tool and the workpiece and a second positioner that effects at a second positioning acceleration a controlled second range of relative movement between the tool and the workpiece, the second controlled range of relative movement being greater than the first controlled range of relative movement and the second positioning acceleration being less than the first positioning acceleration, a method of coordinating the operation of the first and second positioners to minimize displacement imparted by the first positioner relative to that imparted by the second positioner within the respective first and second controlled ranges of relative movement as the first and second positioners concurrently move and selectively position the tool relative to a set of target locations and describe a tool path on the workpiece, comprising:

providing positions commands that define a tool path along which a tool is to be directed at controlled accelerations;

generating from the positioning commands higher bandwidth and lower bandwidth positioning signals that have an inherent delay offset between them;

deriving from the higher bandwidth and lower bandwidth positioning signals respective first and second positioning signals including a compensation delay to compensate for the inherent delay offset between the higher bandwidth and lower bandwidth positioning signals; and deriving from the first and second positioning signals first and second drive signals and applying the first and second drive signals to the respective first and second positioners so that they respond by operating within their controlled ranges of relative movement with at least partly uninterrupted concurrent motion in a coordinated fashion to produce accurate tool positioning along the tool path at the controlled accelerations.

12. The method of claim 11 in which the positioning commands are in an unpanelized format.

13. The method of claim 11 in which the generating the higher bandwidth and lower bandwidth positioning signals includes filtering the positioning commands to generate the lower bandwidth positioning signal and the inherent delay offset.

14. The method of claim 13 in which the filtering to generate the lower bandwidth positioning signal is carried out by a low-pass filtering function.

15. The method of claim 11 in which the deriving the first and second drive signals includes imparting the compensation delay to the positioning commands to form the higher bandwidth positioning signal and processing the higher bandwidth and lower bandwidth positioning signals to produce the first and second positioning signals from which the first and second drive signals are derived.

16. The method of claim 15 in which the processing the higher bandwidth and lower bandwidth positioning signals includes subtracting the lower bandwidth positioning signal from the higher bandwidth positioning signal to produce the first positioning signal.

17. The method of claim 11 in which the compensation delay and the inherent delay offset are substantially the same.

18. The method of claim 11 in which the applying the first and second drive signals includes:

sensing an actual position of one of the first and second positioners;

calculating a positional difference between the actual position and a commanded position specified by a corresponding one of the positioning commands; and using the positional difference to develop one of the first and second drive signals to correct an error in the actual position of the one of the first and second positioners to which the actual position pertains.

19. The method of claim 11 in which the applying the first and second positioning signals includes:

sensing first and second actual positions of the first and second positioners;

calculating first and second positional differences between a commanded position specified by a corresponding one of the positioning commands and the first and second actual positions; and using the first and second positional differences to develop the first and second drive signals to correct errors in the first and second actual positions.

20. The method of claim 11 in which the applying the first and second positioning signals includes operating the first and second positioners in the coordinated fashion such that the tool is rendered temporarily stationary relative to the workpiece while the first and second positioners are moving.

21. The method of claim 11 in which the applying the first positioning signal includes:

sensing first and second actual positions of the first and second positioners;

calculating a first positional difference between a commanded position specified by a corresponding one of the positioning commands and the first and second actual positions; and using the first positional difference to develop the first drive signal to correct at least in part errors in the first and second actual positions.

22. The method of claim 11 in which the tool is at least one of a drill, a punch, a laser, a laser beam, an ion beam, a radiation beam, a microscope, a lens, an optical scanner, and a camera.

* * * * *

UNITED STATES PATENT AND TRADEMARK OFFICE
CERTIFICATE OF CORRECTION

PATENT NO. : 5,751,585

DATED : May 12, 1998

INVENTOR(S) : Donald R. Cutler, Robert M. Pailthorp, and Mark A. Unrath

It is certified that error appears in the above-identified patent and that said Letters Patent is hereby corrected as shown below:

Column 5, line 66, "positioned" should read --positioner--.

Column 11, line 33, "filter 10" should read --filter 170--.

Claim 1, line 16, "position" should read --positioning--.

Claim 11, line 41, "positions" should read --positioning--.

Claim 15, line 6, "the higher" should read --a delayed higher--.

Claim 15, line 7, "higher" should read --delayed higher--.

UNITED STATES PATENT AND TRADEMARK OFFICE
CERTIFICATE OF CORRECTION

PATENT NO. : 5,751,585
DATED : May 12, 1998
INVENTOR(S) : Donald R. Cutler, Robert M. Pailthorp, and Mark A. Unrath It is certified that error appears in the above-identified patent and that said Letters Patent is hereby corrected as shown below:

Claim 16, line 12, "higher" should read --delayed higher--.

Claim 19, line 32, "positioning" should read --drive--.

Claim 20, line 11, "positioning" should read --drive--.

Claim 21, line 16, "positioning" should read --drive--.

Signed and Sealed this

Fifth Day of January, 1999

Attest:

Attesting Officer

*Acting Commissioner of Patents and Trademarks*